US006961669B2

(12) United States Patent
Brunsman

(10) Patent No.: US 6,961,669 B2
(45) Date of Patent: Nov. 1, 2005

(54) DE-EMBEDDING DEVICES UNDER TEST

(75) Inventor: Michael D. Brunsman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 106 days.

(21) Appl. No.: 10/631,284

(22) Filed: Jul. 31, 2003

(65) Prior Publication Data

US 2005/0027469 A1 Feb. 3, 2005

(51) Int. Cl.$^7$ .............................................. G01R 27/32
(52) U.S. Cl. ....................... 702/117; 702/118; 702/126; 324/638
(58) Field of Search ............................. 702/117, 57–59, 702/75, 76, 65, 108, 118, 119, 123, 124, 126, 183, 185, 189, 196, 198, 109; 324/601, 637, 638, 642, 646, 605, 607, 615, 616, 629, 630, 73.1, 76.11, 76.14, 765, 763, 534, 512, 500, 76.21, 158.1; 714/733, 734; 703/13, 14; 257/275

(56) References Cited

U.S. PATENT DOCUMENTS

| | | | | |
|---|---|---|---|---|
| 6,211,541 | B1 | 4/2001 | Carroll et al. ............... | 257/275 |
| 6,665,628 | B2 * | 12/2003 | Martens ....................... | 702/117 |
| 6,744,262 | B2 * | 6/2004 | Adamian .................... | 324/638 |
| 6,832,170 | B2 * | 12/2004 | Martens ....................... | 702/65 |
| 2002/0167304 | A1 | 11/2002 | Di Gregorio et al. .... | 324/158.1 |

OTHER PUBLICATIONS

Kolding, "A Four–Step Method for De–Embedding Gigahertz On–Wafer CMOS Measurements," *IEEE Transactions on Electronic Devices*, Apr. 2000, vol. 47, No. 4, pp. 734–740.

Koolen et al., "An Improved De–Embedding Technique for On–Wafer High–Frequency Characterization," *IEEE 1991 Bipolar Circuits and Technology Meeting 8.1*, 1991, pp. 188–191, no month.

Wu et al., "Unified Accurate CAD Models for RF, Microwave and Millimeter–Wave Integrated Circuits #," *Telsiks'99*, Oct. 13–15, 1999, Nis, Yugoslavia, pp. 6–13.

"Agilent De–embedding and Embedding S–Parameter Networks Using a Vector Network Analyzer, Application Note 1364–1," *Agilent Technologies*, pp. 1–24, Mar. 22, 2001.

* cited by examiner

*Primary Examiner*—Hal Wachsman
(74) *Attorney, Agent, or Firm*—David G. Dolezal; Michael P. Noonan

(57) ABSTRACT

A system for de-embedding electrical characteristics to obtain the intrinsic electrical characteristics of a device under test. The system includes obtaining a set of S parameter data from measurements of a thru test structure and partitioning that set into a set of input S parameters and a set of output S parameters. The set of input S parameters and the set of output S parameters are converted to sets of input ABCD parameters and output ABCD parameters, respectively. An inverse matrix of the set of input ABCD parameters is cascaded with a matrix of a set of ABCD parameters representative of the electrical characteristics of a test structure including the device under test. The resultant matrix is then cascaded with the inverse matrix of the set of output ABCD parameters to obtain a set of device ABCD parameters representative of the intrinsic electrical characteristics of the device under test.

22 Claims, 4 Drawing Sheets

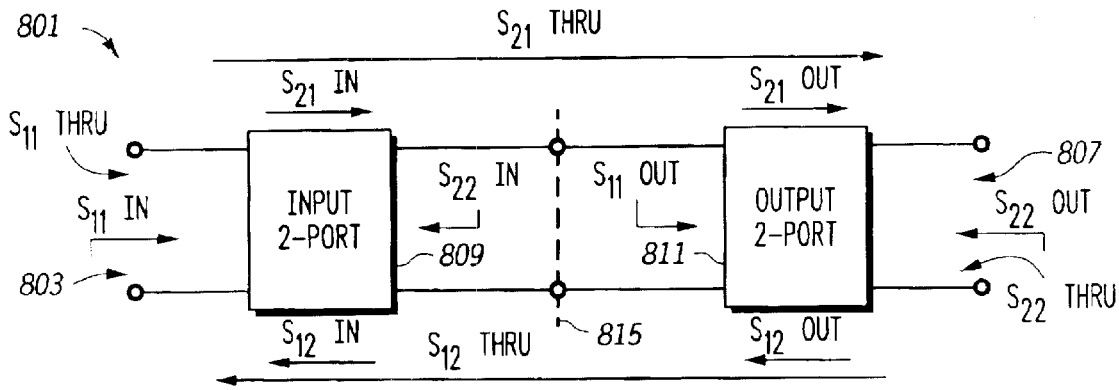
*FIG. 8*
901 → $S_{11}$ IN = $S_{11}$ THRU
903 → $S_{22}$ OUT = $S_{22}$ THRU
905 → $S_{22}$ IN = $S_{11}$ OUT = $0 + j0$
907 → $|S_{21}$ IN$| = |S_{21}$ OUT$| = \sqrt[X]{|S_{21}\ THRU|}$
909 → $\angle S_{21}$ IN $= \angle S_{21}$ OUT $= \dfrac{\angle S_{21}\ THRU}{X}$
911 → $|S_{12}$ IN$| = |S_{12}$ OUT$| = \sqrt[X]{|S_{12}\ THRU|}$
913 → $\angle S_{12}$ IN $= \angle S_{12}$ OUT $= \dfrac{\angle S_{12}\ THRU}{X}$
915 → $X = \dfrac{b + a}{a}$
*FIG. 9*
1001 →
$$DMBD_{ABCD} = IN_{ABCD}^{-1} * OUT_{ABCD} * OUT_{ABCD}^{-1}$$
*FIG. 10*
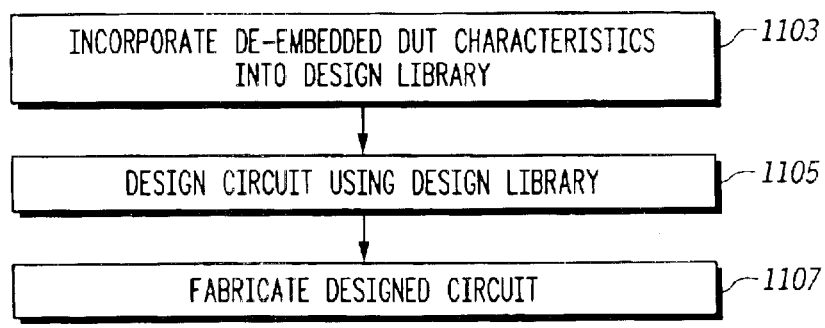
*FIG. 11*

DE-EMBEDDING DEVICES UNDER TEST

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

This invention relates in general to electronic circuits and in particular to de-embedding devices.

2. Description of the Related Art

In the design of integrated circuits such as e.g. high-frequency/RF integrated circuits, it is desired that only the intrinsic characteristics of the underlying semiconductor devices be incorporated in the design process. Typically, determination of the intrinsic characteristics is accomplished in a manner such that unwanted parasitics are introduced into the characterization process, due to the process of fabricating the associated test devices. De-embedding is a process that is utilized to remove the effects of the parasitics from the characteristics of a device under test.

FIGS. 1–4 are functional schematics of 2-port test structures typically used in prior art de-embedding processes. FIG. 1 is a schematic representation of test structure 101 that includes a transmission configured two terminal device under test (DUT) 111, shown as a two-port network. Examples of such devices include capacitors, diodes, inductors, resisters, or any other two terminal device. In one embodiment, DUT 111 is fabricated on a substrate of a semiconductor wafer with input port 103 and output port 107 located on the wafer surface for radio frequency (rf) characterization.

FIG. 2 is a schematic representation of a "thru" test structure typically used for de-embedding the electrical characteristics of DUT 111. It is desirable that test structure 201 have the same electrical length and port characteristics as test structure 101 exclusive of DUT 111.

FIG. 3 is a schematic representation of a "short" test structure typically used for de-embedding the electrical characteristics of DUT 111. It is desirable that test structure 301 have the same port characteristics and the same electrical length as test structure 101, but with rf "shorts" at locations corresponding to the locations of port-1 and port-2 of DUT 111.

FIG. 4 is a schematic representation of an "open" test structure typically used for de-embedding the electrical characteristics of DUT 111. It is desirable that test structure 401 have the same port characteristics and the same electrical length as test structure 101, but with rf "opens" at locations corresponding to the locations of port-1 and port-2 of DUT 111.

Test structures 201, 301, and 401 are constructed from the same fabrication process as test structure 101 of FIG. 1.

A prior art process of de-embedding typically involves the collection of scattering (S) parameters on test structures 101, 201, 301, and 401. The S parameters from test structure 101 are then modified to remove the effects of parasitics associated with test structure 101 as determined from the S parameters collected from test structures 201, 301, and 401. With some prior art de-embedding processes, test structure 201 may not be required.

The process of de-embedding described above requires the fabrication of three additional test structures (201, 301, and 401). Each additional test structure requires/occupies additional wafer area and increases testing time and complexity. What is desired is an improved process of de-embedding.

BRIEF DESCRIPTION OF THE DRAWINGS

The present invention may be better understood, and its numerous objects, features, and advantages made apparent to those skilled in the art by referencing the accompanying drawings.

FIG. 8 is a schematic representation illustrating one embodiment of a partitioning of the electrical characteristics of a thru test structure into electrical characteristics of two two-port networks according to the present invention.

FIG. 9 shows one embodiment of equations setting forth constraints in partitioning the electrical characteristics of a thru test structure into electrical characteristics of two two-port networks according to the present invention.

FIG. 10 sets forth one embodiment of an equation for obtaining intrinsic characteristics of a device under test according to the present invention.

FIG. 11 is a flow diagram setting forth one embodiment of a method for design and fabricating an integrated circuit according to the present invention.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
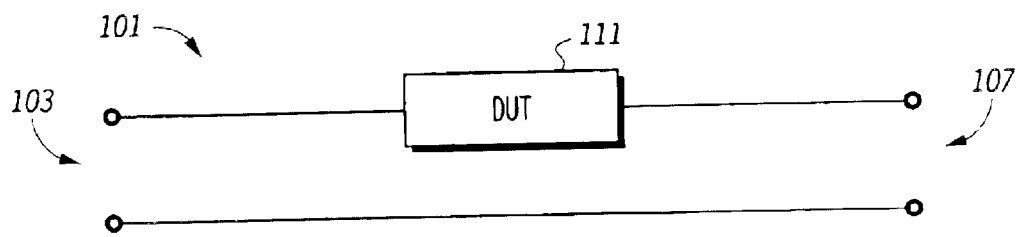
FIG. 1 is a schematic representation of a test structure used in a prior art de-embedding process.
Figure 2:
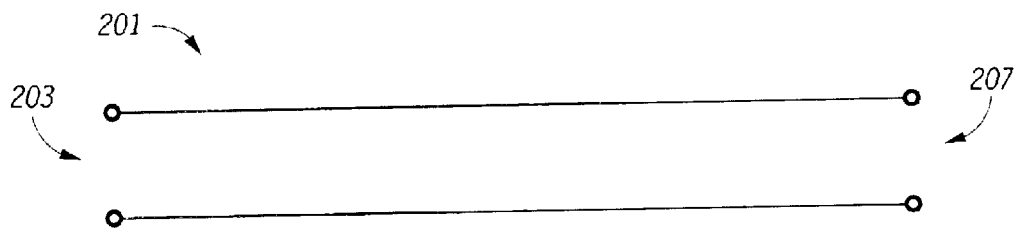
FIG. 2 is a schematic representation of a test structure used in a prior art de-embedding process.
Figure 3:
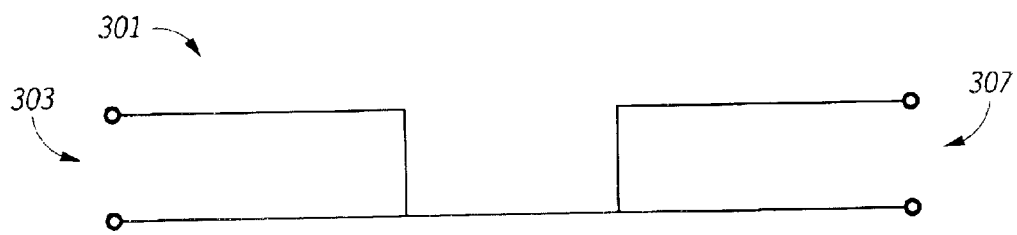
FIG. 3 is a schematic representation of a test structure used in a prior art de-embedding process.
Figure 4:
FIG. 4 is a schematic representation of a test structure used in a prior art de-embedding process.
Figure 5:
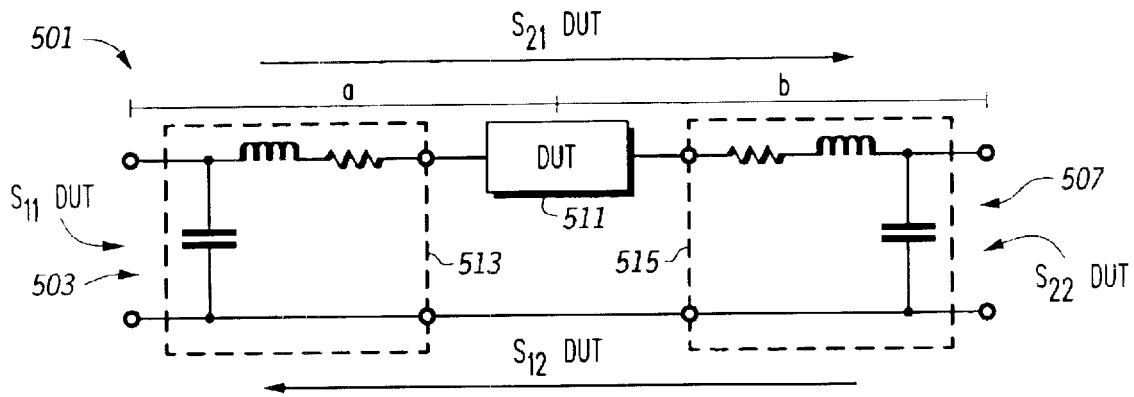
FIG. 5 is a schematic representation of a test structure used in one embodiment of a de-embedding process according to the present invention.

FIG. 5 is a schematic representation of test structure 501 that includes a transmission configured two terminal device under test (DUT) 511. DUT 511 is a device in which it is desired to obtain its intrinsic properties. Examples of such devices include capacitors, diodes, inductors, resisters, or any other two terminal device in an integrated circuit. Circuit 513 represents the parasitics of the structures between input port 503 and DUT 511, and circuit 515 represents the parasitics of the structures between output port 507 and DUT 511.

In one embodiment, DUT 511 is fabricated on the substrate of a semiconductor wafer with input port 503 and output port 507 located on the wafer surface for radio frequency (rf) characterization. In one embodiment, ports 503 and 507 are implemented in a ground-signal-ground (GSG) configuration. However, structure 501 may represent test structures having other testing configurations.

Figure 6:
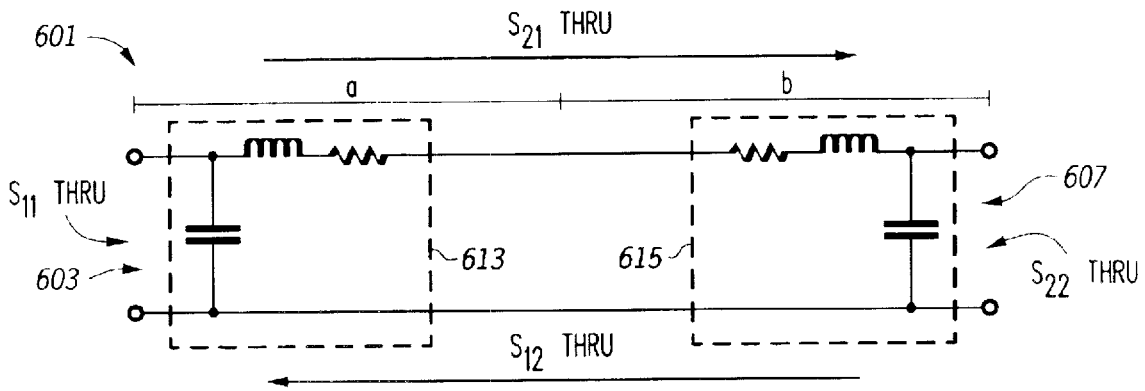
FIG. 6 is a schematic representation of a test structure used in one embodiment of a de-embedding process according to the present invention.

FIG. 6 is a schematic representation of a thru test structure 601, exclusive of the DUT, used for de-embedding the electrical characteristics of DUT 511. In one embodiment, test structure 601 is fabricated from the same process as test structure 501 of FIG. 5. Circuit 613 represents the parasitics associated with input port 603 and circuit 615 represents the parasitics associated with the output port 607 of thru test structure 601. In one embodiment, test structure 601 has the same electrical length and port characteristics as test structure 501, exclusive of DUT 511.

Figure 7:
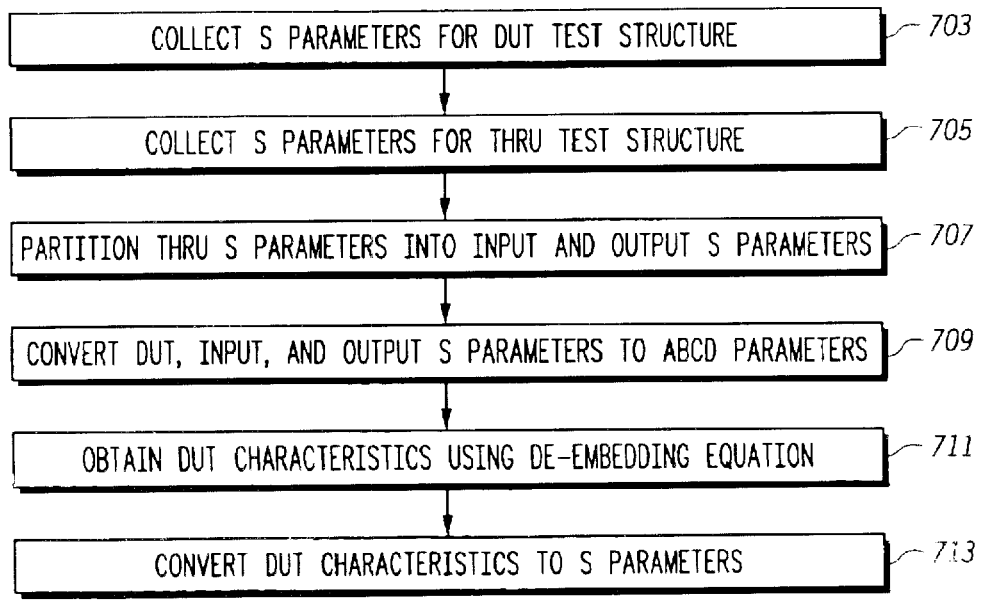
FIG. 7 is a flow diagram setting forth one embodiment of a de-embedding process according to the present invention.

FIG. 7 is a flow diagram of setting forth one embodiment of a de-embedding process for obtaining intrinsic characteristics of a DUT. The de-embedding process shown in FIG. 7 involves collecting sets of S parameters from two structures, test structure 501 and thru test structure 601.

In operation 703, S parameters are collected from DUT test structure 501. Referring back to FIG. 5, in one embodiment of operation 703, the input reflection coefficient ($S_{11}$ DUT), the output reflection coefficient ($S_{22}$ DUT), the forward transmission coefficient ($S_{21}$ DUT), and the reverse transmission coefficient ($S_{12}$ DUT) are obtained from structure 501. In one embodiment, these parameters are obtained by rf characterizations of test structure 501 using a calibrated automatic network analyzer (ANA). See FIG. 12.

In operation 705, S parameters are collected from thru test structure 601. Referring back to FIG. 6, in one embodiment of operation 705, the input reflection coefficient ($S_{11}$ THRU), the output reflection coefficient ($S_{22}$ THRU), the forward transmission coefficient ($S_{21}$ THRU), and the reverse transmission coefficient ($S_{12}$ THRU) are obtained from structure 601. In one embodiment, these parameters are obtained by rf characterizations of test structure 601 using a calibrated automatic network analyzer (ANA).

In operation 707, the electrical characteristics of thru test structure 601 (as represented by the S parameters obtained from thru test structure 601) are partioned into two sets of 2-port S parameters, an input set and an output set. Each set represents the characteristics of a two-port network.

FIG. 8 represents characteristics of the equivalently partitioned thru network 801. Network 801 includes a two-port input network 809, a two-port output network 811, and a virtual reflectionless node 815. The S parameters of input network 809 and output network 811 are parameters that are partitioned from the S parameters obtained from thru test structure 601. The characteristics of network 809 and network 811 are such that when combined, result in the retention of the electrical characteristics of the thru test structure 601.

Virtual node 815 represents a reflectionless node representative of the point of insertion of a DUT.

FIG. 9 sets forth the conditions for partitioning the electrical characteristics of thru test structure 601 into the S parameters associated with input network 809 and S parameters associated with output network 811. Regarding equation, 901, the input reflection coefficient ($S_{11}$ IN) of input network 809 is set equal to the measured input reflection coefficient ($S_{11}$ THRU) of test structure 601. Regarding equation, 903, the output reflection coefficient ($S_{22}$ OUT) of output network 811 is set equal to the measured output reflection coefficient ($S_{22}$ THRU) of test structure 601.

Regarding equation 905, the output refection coefficient ($S_{22}$ IN) of input network 809 and the input reflection coefficient ($S_{11}$ OUT) of the output network 811 are set such that a zero reflection coefficient (0+j0) results.

Equations 907, 909, 911, 913 establish the transmission characteristics of input network 809 and output network 811. $S_{21}$ IN is the forward transmission coefficient and $S_{12}$ IN is the reverse transmission of input network 809. $S_{21}$ OUT is the forward transmission coefficient and $S_{12}$ OUT is the reverse transmission coefficient of output network 811. As shown in equations 907 and 911, the magnitude of the forward and reverse transmission coefficients of input network 809 and output network 811 are equal to the magnitude of the forward and reverse transmission coefficients, respectively, obtained from thru test structure 601 raised to a power of 1 over a partitioning factor(X). As shown by equations 909 and 913, the angles of the forward and reverse transmission coefficients of input network 809 and output network 811 are equal to the angles of the forward and reverse transmission coefficients ($S_2$ THRU and $S_{12}$ THRU) respectively, divided by the partitioning factor.

X represents the partitioning factor that, in one embodiment, is based on the geometric location of DUT 511 in the test structure 501. Referring back to FIG. 5, in one embodiment, X is calculated as the distance from input port 503 to output port 507 (a+b) divided by the distance from DUT 511 to input port 503 (a). In embodiments where a is equal to b, the X partitioning factor is 2.

In one embodiment where the measured S parameters exist in real and imaginary format, the parameters are converted to magnitude and phase format for implementation of equations 907, 909, 911, and 913. Afterwards, the resultant S parameters are converted back to a real and imaginary format.

Referring back to FIG. 7, in operation 709 the S parameters obtained from DUT test structure 601 and the partitioned characteristics of in network 809 and out network 811 are then converted to transmission (ABCD) parameters using standard conversion format.

In 711, the intrinsic characteristics of DUT 511 are derived (represented in ABCD parameters) using equation 1001 of FIG. 10. $DMBD_{ABCD}$ represents a matrix of the intrinsic characteristics of DUT 511 in ABCD parameters. $IN_{ABCD}^{-1}$ represents the inverse matrix of input network 809 characteristics in ABCD parameters. $OUT_{ABCD}^{-1}$ represents the inverse matrix of output network 811 characteristics in ABCD parameters. As shown in equation 1001, the intrinsic characteristics of DUT 511 is derived by cascading the inverse matrix of the input network characteristics $IN_{ABCD}^{-1}$ with the matrix of measured characteristics obtained from structure 501, and then cascading the resultant matrix with the inverse matrix of the output network characteristics $OUT_{ABCD}^{-1}$.

Referring back to FIG. 7, the DUT characteristics (in ABCD parameters) are converted back to S parameters in 713.

Utilizing the above de-embedding process may provide a de-embedding process from which the intrinsic characteristics of a transmission configured two terminal device can be derived from collecting data from only one additional test structure. Accordingly, such a de-embedding scheme may be implemented using less wafer space, require less testing time, and affording the ability to determine the desired characteristics directly via measurement.

FIG. 11 is a flow diagram for fabricating an integrated circuit using the intrinsic characteristics obtained by a process similar to the process set forth in FIG. 9. In 1103, the intrinsic characteristics of devices under test that were obtained from a de-embedding processes similar to that set forth in FIG. 7 are incorporated in a design library. In 1105, the design library is used to produce a design for a circuit. In 1107, the circuit is fabricated from the design produced in 1105.

Figure 12:
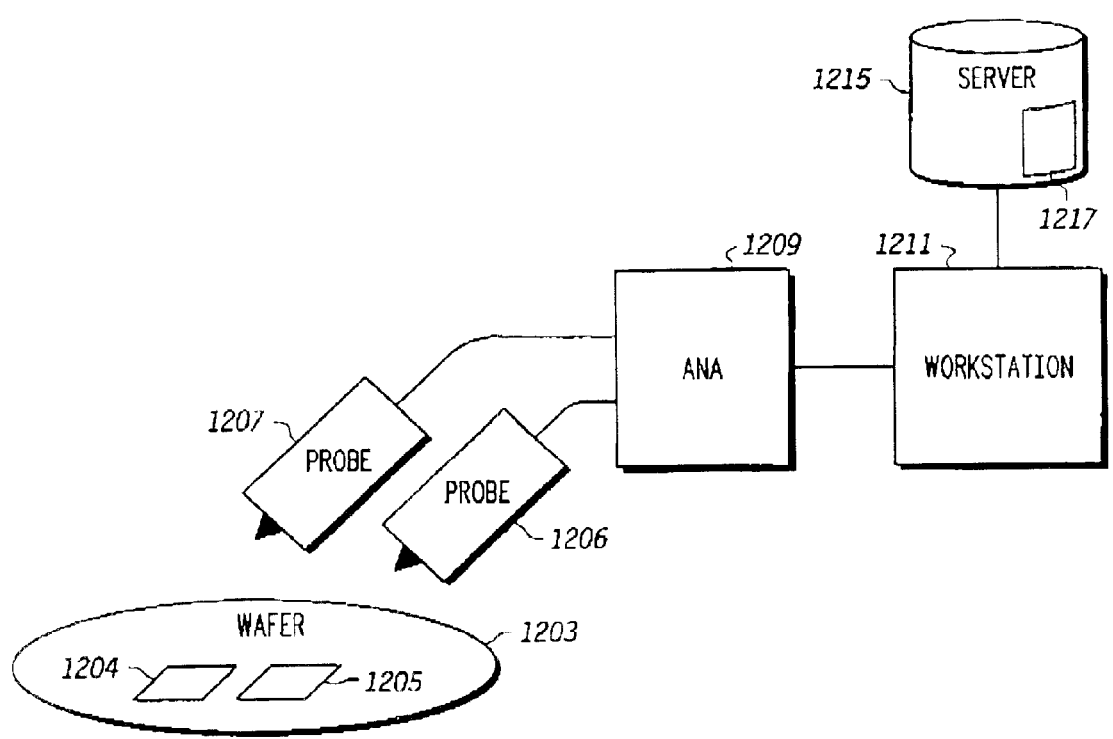
FIG. 12 is block diagram of one embodiment of a system for obtaining intrinsic characteristics of a DUT according to the present invention.

FIG. 12 is block diagram of one embodiment of a system for obtaining intrinsic characteristics of a DUT according to the present invention. A DUT is located in a test structure 1205 fabricated on the substrate of wafer 1203. A thru test structure 1204 is also located on wafer 1203. Probes 1206 and 1207 are used to facilitate obtaining S parameter data from structure 1204 and structure 1205. The probes are operably coupled to calibrated automatic network analyzer 1209 (ANA). Network analyzer 1209 is controlled by code 1217 running on workstation 1211. Code 1217 is down loaded from storage media of 1217 (e.g. hard drives) of a server 1215 by workstation 1211. In other embodiments, code 1217 may be located on a hardrive of personal computer system or down loaded from a removable media (e.g. CDRom). In other embodiments, code 1217 may be executed by a processor located in network analyzer 1209. In one embodiment, the code is implemented in IC-CAP circuit simulation software sold by AGILENT-EESOF.

Set forth below is one embodiment of software code used for implementing operations 707, 709, 711, and 713 of FIG. 7. The code is written in an adaptation of the BASIC language. This code is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

Below is listed one embodiment of code for partitioning the measured S parameters of a thru-test structure (e.g. 601) into a set of S parameters representative of an input network (e.g. 809).

```
i1=0
 i=0
  WHILE i < SIZE(thru)
     In_2_port.11[i]=thru.11[i1]
     !
     !********* S12 *********
     !
Rev_Mag.12[i]=(real(thru.12[i1]) ^2+imag(thru.12[i1]) ^2) ^0.5
     Mag_In_2_port.12[i]=Rev_Mag.12[i] ^var2
     !
     Rev_Arg.12[i]=imag(thru.12[i1])//real(thru.12[i1])
     Angle_In_2_port.12[i]=atn(Rev_Arg.12[i])//var1
     !
     ! if Angle_In_2_port.12[i] > 0 then
     !    Angle_In_2_port.12[i] = Angle_In_2_port.12[i]-1.57
     ! end if
     !
Real_In_2_port.12[i]=cos(pct_1*Angle_In_2_port.12[i])*Mag_In_2
_port.12[i]
Imag_In_2_port.12[i]=sin(pct_1*Angle_In_2_port.12[i])*Mag_In_2
_port.12[i]
     !
In_2_port.12[i]=(Real_In_2_port.12[i])+j*(Imag_In_2_port.12[i])
     !
     !********* S21 *********
     !
Fwd_Mag.21[i]=(real(thru.21[i1]) ^2+imag(thru.21[i1]) ^2) ^0.5
     Mag_In_2_port.21[i]=Fwd_Mag.21[i] ^var2
     !
     Fwd_Arg.21[i]=imag(thru.21[i1])//real(thru.21[i1])
```

-continued

```
     Angle_In_2_port.21[i]=atn(Fwd_Arg.21[i])//var1
     !
     ! if Angle_In_2_port.21[i] > 0 then
     !    Angle_In_2_port.21[i] = Angle_In_2_port.21[i]-1.57
     ! end if
     !
Real_In_2_port.21[i]=cos(pct_1*Angle_In_2_port.21[i])*Mag_In_2
_port.21[i]
Imag_In_2_port.21[i]=sin(pct_1*Angle_In_2_port.21[i])*Mag_In_2
_port.21[i]
     !
In_2_port.21[i]=(Real_In_2_port.21[i])+j*(Imag_In_2_port.21[i])
     !
     In_2_port.22[i]=0+j0
     i1=i1+1
     IF i1>=size_thru THEN i1=0
     i = i + 1
  END WHILE
  !
  RETURN In_2_port
```

Below is listed one embodiment of code for partitioning the S parameters of a thru test structure (e.g. 601) into a set of S parameters representative of an output network (e.g. 811).

```
i1=0
 i=0
  WHILE i < SIZE(thru)
     Out_2_port.11[i]=0+j0
     !
     !********* S12 *********
     !
Rev_Mag.12[i]=(real(thru.12[i1]) ^2+imag(thru.12[i1]) ^2) ^0.5
     Mag_Out_2_port.12[i]=(Rev_Mag.12[i]) ^var2
     !
     Rev_Arg.12[i]=imag(thru.12[i1])//real(thru.12[i1])
     Angle_Out_2_port.12[i]=atn(Rev_Arg.12[i])//var1
     !
     ! if Angle_Out_2_port.12[i] > 0 then
     !    Angle_Out_2_port.12[i] = Angle_Out_2_port.12[i]-1.57
     ! end if
     !
Real_Out_2_port.12[i]=cos(pct_1*Angle_Out_2_port.12[i])*Mag_Ou
t_2_port.12[i]
Imag_Out_2_port.12[i]=sin(pct_1*Angle_Out_2_port.12[i])*Mag_Ou
t_2_port.12[i]
     !
Out_2_port.12[i]=(Real_Out_2_port.12[i])+j* (Imag_Out_2_port.12
[i])
     !
     !********* S21 *********
     !
Fwd_Mag.21[i]=(real(thru.21[i1]) ^2+imag(thru.21[i1]) ^2) ^0.5
     Mag_Out_2_port.21[i]=(Fwd_Mag.21[i]) ^var2
     !
     Fwd_Arg.21[i]=imag(thru.21[i1])//real(thru.21[i1])
     Angle_Out_2_port.21[i]=atn(Fwd_Arg.21[i])//var1
     !
     ! if Angle_Out_2_port.21[i] > 0 then
     !    Angle_Out_2_port.21[i] = Angle_Out_2_port.21[i]-1.57
     ! end if
     !
Real_Out_2_port.21[i]=cos(pct_1*Angle_Out_2_port.21[i])*Mag_Ou
t_2_port.21[i]
Imag_Out_2_port.21[i]=sin(pct_1*Angle_Out_2_port.21[i])*Mag_Ou
t_2_port.21[i]
     !
Out_2_port.21[i]=(Real_Out_2_port.21[i])+j*(Imag_Out_2_port.21
[i])
     !
     Out_2_port.22[i]=thru.22[i1]
     i1=i1+1
     IF i1>=size_thru THEN i1=0
```

-continued

```
    i = i + 1
END WHILE
!
RETURN Out_2_port
```

Below is one embodiment of code for converting a set of measured DUT test structure S parameters and sets of S parameters representative of an input network and an output network to sets of ABCD parameters. The code below also obtains the intrinsic characteristics of the DUT in ABCD parameters and converts them back to S parameters.

```
i1=0
i=0
WHILE i < SIZE(total)
    L_dummy_act.11[i]=L_dummy.11[i1]
    L_dummy_act.12[i]=L_dummy.12[i1]
    L_dummy_act.21[i]=L_dummy.21[i1]
    L_dummy_act.22[i]=L_dummy.22[i1]
    R_dummy_act.11[i]=R_dummy.11[i1]
    R_dummy_act.12[i]=R_dummy.12[i1]
    R_dummy_act.21[i]=R_dummy.21[i1]
    R_dummy_act.22[i]=R_dummy.22[i1]
    i1=i1+1
    IF i1>=size_dummy THEN i1=0
    i = i + 1
END WHILE
!
PRINT "now do the de-embedding using ABCD matrix manipulation
..."
!
xtor=TwoPort(L_dummy_act,"S","A") ^-1 * TwoPort(total,"S","A")
  * TwoPort(R_dummy_act,"S","A") ^-1
xtor=TwoPort(xtor,"A","S")
!
RETURN xtor
```

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for de-embedding a device under test, the method comprising:
   representing electrical characteristics of a test structure including a device under test using a set of test structure ABCD parameters;
   representing electrical characteristics of a thru test structure using a set of thru S parameters;
   partitioning the set of thru S parameters into a first set of partitioned S parameters and a second set of partitioned S parameters;
   converting the first set of partitioned S parameters into a first set of partitioned ABCD parameters;
   converting the second set of partitioned S parameters into a second set of partitioned ABCD parameters; and
   using the first set of partitioned ABCD parameters, the second set of partitioned ABCD parameters, and the set of test structure ABCD parameters to produce a set of device ABCD parameters representative of intrinsic electrical characteristics of the device under test.

2. The method of claim 1 wherein representing electrical characteristics of a thru test structure using a set of thru S parameters further includes measuring electrical characteristics of the thru test structure to provide the set of thru S parameters.

3. The method of claim 1 wherein the representing electrical characteristics of a test structure including a device under test using a set of test structure ABCD parameters further comprises:
   measuring electrical characteristics of the test structure to provide a set of S parameters; and
   converting the set of S parameters into the set of test structure ABCD parameters.

4. The method of claim 1 wherein the first set of partitioned S parameters is characterized as a set of input S parameters and the second set of partitioned S parameters is characterized as a set of output S parameters.

5. The method of claim 4 wherein the set of input S parameters represent electrical characteristics of a two-port input network and the set of output S parameters represent electrical characteristics of a two-port output network.

6. The method of claim 5 wherein the set of thru S parameters comprise:
   a thru input reflection coefficient $S_{11}THRU$,
   a thru output reflection coefficient $S_{22}THRU$,
   a thru forward transmission coefficient $S_{21}THRU$; and
   a thru reverse transmission coefficient $S_{12}THRU$.

7. The method of claim 6 wherein the partitioning comprises:
   defining an input reflection coefficient $S_{11}IN$ of the set of input S parameters to be equal to the thru input reflection coefficient $S_{11}THRU$;
   defining an output reflection coefficient $S_{22}OUT$ of the set of output S parameters to be equal to the thru output reflection coefficient $S_{22}THRU$; and
   defining an output reflection coefficient $S_{22}IN$ of the set of input S parameters to be equal to an input reflection coefficient $S_{11}OUT$ of the set of output S parameters.

8. The method of claim 6 wherein the partitioning further comprises:
   defining a magnitude of a forward transmission coefficient $S_{21}IN$ of the set of input S parameters to be equal to a magnitude of a forward transmission coefficient $S_{21}OUT$ of the set of output S parameters; and
   defining a magnitude of a reverse transmission coefficient $S_{12}IN$ of the set of input S parameters to be equal to a magnitude of a set reverse transmission coefficient $S_{12}OUT$ of the set of output S parameters.

9. The method of claim 8 further comprising:
   defining the magnitude of the forward transmission coefficient $S_{21}IN$ and the magnitude of the forward transmission coefficient $S_{21}OUT$ to be equal to an Xth root of the magnitude of the thru forward transmission coefficient $S_{21}THRU$; and
   defining the magnitude of the reverse transmission coefficient $S_{12}IN$ and the magnitude of the reverse transmission coefficient $S_{12}OUT$ to be equal to an Xth root of the magnitude of the thru reverse transmission coefficient $S_{12}THRU$.

10. The method of claim 9 wherein X corresponds to a ratio of geometric distances measurable between an input node to the device under test of the test structure and the input node to an output node of the test structure.

11. The method of claim 9 wherein X is substantially equal to 2 when the device under test is substantially at a midpoint between the input node and the output node of the test structure.

12. The method of claim 6 wherein the partitioning comprises:
defining an angle of a forward transmission coefficient $S_{21}$IN of the set of input S parameters to be equal to an angle of a forward transmission coefficient $S_{21}$OUT of the set of output S parameters; and
defining an angle of a reverse transmission coefficient $S_{12}$IN of the set of input S parameters to be equal to an angle of a reverse transmission coefficient $S_{12}$OUT of the set of output S parameters.

13. The method of claim 6 wherein a forward transmission coefficient $S_{21}$IN of the set of input S parameters, a forward transmission coefficient $S_{21}$OUT of the set of output S parameters, and the thru forward transmission coefficient $S_{21}$THRU are determined to have the following relationship:

$$\angle S_{21}\text{IN} = \angle S_{21}\text{OUT} = (S_{21}\text{THRU})/X.$$

14. The method of claim 13 wherein X corresponds to a ratio of geometric distances measurable between an input node to the device under test of the test structure and the input node to an output node of the test structure.

15. The method of claim 6 wherein a reverse transmission coefficient $S_{12}$IN of the set of input S parameters, a reverse transmission coefficient $S_{12}$OUT of the set of output S parameters, and the thru reverse transmission coefficient $S_{12}$THRU are determined to have the following relationship:

$$\angle S_{12}\text{IN} = \angle S_{12}\text{OUT} = (\angle S_{12}\text{THRU})/X.$$

16. The method of claim 6 further comprising:
defining an output reflection coefficient $S_{22}$IN of the set of input S parameters and an input reflection coefficient $S_{11}$OUT of the set of output S parameters to be equal to $0+j0$.

17. The method of claim 4 wherein the set of thru S parameters are recoverable by cascading the set of input S parameters and the set of output S parameters.

18. The method of claim 4 wherein the using comprises:
cascading an inverse matrix of the first set of partitioned ABCD parameters with a matrix of the set of test structure ABCD parameters to produce an intermediate matrix; and
cascading the intermediate matrix with an inverse matrix of the second set of partitioned ABCD parameters to produce a matrix of the set of device ABCD parameters.

19. The method of claim 18, wherein the cascading an inverse matrix and the cascading the intermediate matrix each comprises performing a matrix multiplication.

20. The method of claim 1 further comprising:
providing a de-embedded representation of the electrical characteristics of the device with substantially no parasitic characteristic information in such representation; and
incorporating the de-embedded representation of the electrical characteristics of the device into a circuit design library.

21. The method of claim 20 further comprising:
designing a circuit using the circuit design library.

22. The method of claim 21 further comprising:
fabricating an integrated circuit including the designed circuit.

* * * * *